(12) United States Patent
Song (10) Patent No.: US 9,870,813 B2
(45) Date of Patent: Jan. 16, 2018

(54) SEMICONDUCTOR DEVICE AND SEMICONDUCTOR SYSTEM INCLUDING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/863,092

(22) Filed: Sep. 23, 2015

(65) Prior Publication Data

US 2016/0336058 A1 Nov. 17, 2016

(30) Foreign Application Priority Data

May 11, 2015 (KR) ........................ 10-2015-0065359

(51) Int. Cl.
*G11C 11/40* (2006.01)
*G11C 11/4076* (2006.01)
*G11C 7/10* (2006.01)

(52) U.S. Cl.
CPC .......... *G11C 11/4076* (2013.01); *G11C 7/109* (2013.01)

(58) Field of Classification Search
CPC ............ G11C 11/4076; G11C 11/4096; G11C 11/4087
See application file for complete search history.

(56) References Cited

U.S. PATENT DOCUMENTS

| 7,099,228 | B2* | 8/2006 | Koo | G11C 7/1039 365/194 |
| 9,007,849 | B2* | 4/2015 | Song | G06F 13/1689 365/189.05 |
| 2010/0195429 | A1* | 8/2010 | Sonoda | G11C 11/406 365/222 |
| 2013/0223177 | A1* | 8/2013 | Cho | G11C 8/06 365/230.06 |
| 2014/0250353 | A1* | 9/2014 | Choi | G06F 11/1048 714/800 |
| 2014/0254295 | A1* | 9/2014 | Shim | G11C 7/1072 365/194 |

FOREIGN PATENT DOCUMENTS

KR 1020140109209 9/2014

* cited by examiner

*Primary Examiner* — Douglas King
(74) *Attorney, Agent, or Firm* — IP & T Group LLP (57) ABSTRACT

A semiconductor device includes: a command decoding unit suitable for decoding external command signals to generate an internal command signal; and a pulse control unit suitable for controlling a pulse width of the internal command signal.

10 Claims, 5 Drawing Sheets

SEMICONDUCTOR DEVICE AND SEMICONDUCTOR SYSTEM INCLUDING THE SAME

CROSS-REFERENCE TO RELATED APPLICATIONS

The present application claims priority of Korean Patent Application No. 10-2015-0065359, filed on May 11, 2015, which is incorporated herein by reference in its entirety.

BACKGROUND

1. Field

Various embodiments of the present invention relate to a semiconductor design technology, and more particularly, to a semiconductor device for generating internal command signals.

2. Description of the Related Art

In general, semiconductor devices including a double data rate synchronous DRAM (DDR SDRAM) receive an external command from the outside. The external command is inputted in a form of various command signals (hereinafter, referred to as "external command signals"). The semiconductor devices perform various operations corresponding to the external command signals by decoding the external command signals. For example, a semiconductor device may perform an active operation, a precharge operation, a write operation, a read operation or the like in response to the external command signals. The external command signals inputted to the semiconductor device are an active signal, a chip select signal, a row address strobe (RAS) signal, a column address strobe (CAS) signal, a write enable signal, and the like.

Figure 1:
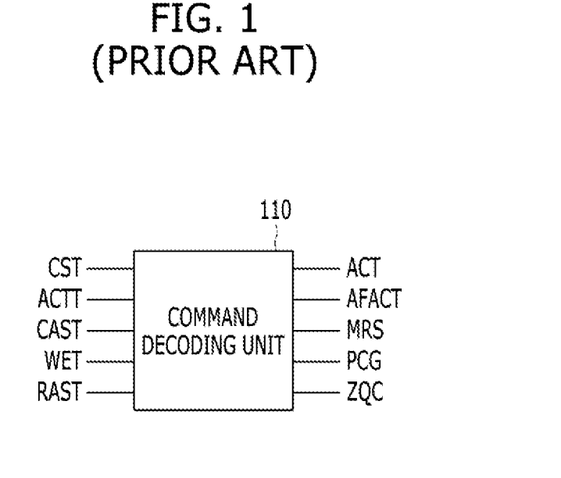
FIG. 1 is a block diagram illustrating a conventional internal command signal generating circuit.

FIG. 1 is a block diagram illustrating a conventional internal command signal generating circuit.

Referring to FIG. 1, the conventional internal command signal generating circuit includes a command decoding unit 110. The command decoding unit 110 receives and decodes external command signals "CST", "ACTT", "CAST", "WET" and "RAST", and generates internal command signals "ACT", "AFACT", "MRS", "PCG" and "ZQC". Here, the external command signals "CST", "ACTT", "CAST", "WET" and "RAST" correspond to a chip select signal, an active signal, a column address strobe signal, a write enable signal and a row address strobe signal, respectively. In addition, the internal command signals "ACT", "AFACT", "MRS", "PCG" and "ZQC" are internal command signals for activating corresponding operations. The internal command signal "ACT" is a signal for an active operation, the internal command signal "AFACT" is a signal for a refresh operation, the internal command signal "MRS" is a signal for a mode setting operation, the internal command signal "PCG" is a signal for a precharge operation, and the internal command signal "ZQC" is a signal for an impedance calibration operation of an output pad. Meanwhile, to operate semiconductor devices at a higher speed, the frequencies of clock signals applied from the outside become higher. A frequency of a clock signal determines the operating frequency of a semiconductor device

SUMMARY

Various embodiments are directed to provide a semiconductor device capable of stably securing pulse widths of internal command signals.

In accordance with an embodiment of the present invention, a semiconductor device may include: a command decoding unit suitable for decoding external command signals to generate an internal command signal; and a pulse control unit suitable for controlling a pulse width of the internal command signal.

The semiconductor device may further include a delay unit suitable for reflecting a time corresponding to a decoding operation of the command decoding unit into a first clock signal to generate a second clock signal.

The pulse control unit may output a final internal command signal in response to the second clock signal.

The pulse control unit may adjust the pulse width of the internal command signal to correspond to the pulse width of the second clock signal to output the final internal command signal.

The pulse control unit may include: a synchronization unit suitable for outputting the internal command signal in synchronization with the second clock signal; and a pulse width adjusting unit suitable for adjusting the pulse width of an output signal of the synchronization unit to output the final internal command signal.

In accordance with another embodiment of the present invention, a semiconductor device may include: a command decoding unit suitable for decoding external command signals to generate an internal command signal; a command separation unit suitable for separating the decoded command signal based on first information corresponding to an application interval of external commands, and second information corresponding to the pulse width of a final internal command signal; a pulse control unit suitable for adjusting an output signal of the command separation unit to have a pulse width corresponding to the second information, and generating the final internal command signal; and a plurality of operation units suitable for performing operations corresponding to the external command signals in response to the final internal command signals.

The command separation unit may compare the first information and the second information to output the decoded command signal as it is, or separates the decoded command signal in regular sequence.

The operation units may be simultaneously or sequentially activated in response to the final internal command signal.

In accordance with yet another embodiment of the present invention, a semiconductor system may include: a controller suitable for outputting external command signals at a preset interval; and a semiconductor device suitable for decoding the external command signals to generate an internal command signal, wherein the semiconductor device includes a plurality of operation units, compares information corresponding to the preset interval with information corresponding to a pulse width of the internal command signal, and adjusts a pulse width of the internal command signal an operation unit corresponding to the internal command signal to operate in response to the external command signal.

The controller may provide the semiconductor device with the information corresponding to the preset interval.

The semiconductor device may further comprise an internal command signal generating unit suitable for generating the internal command signal based on the information corresponding to the preset interval and the information corresponding to the pulse width of the internal command signal.

The internal command signal generating unit may include: a command decoding unit suitable for decoding the external command signals to generate the internal command signal; a command separation unit suitable for separating the decoded command signal based on the information corresponding to the preset interval and the information corresponding to the pulse width of the internal command signal; and a pulse control unit suitable for adjusting an output signal of the command separation unit to have the pulse width, and generating the internal command signal.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 2:
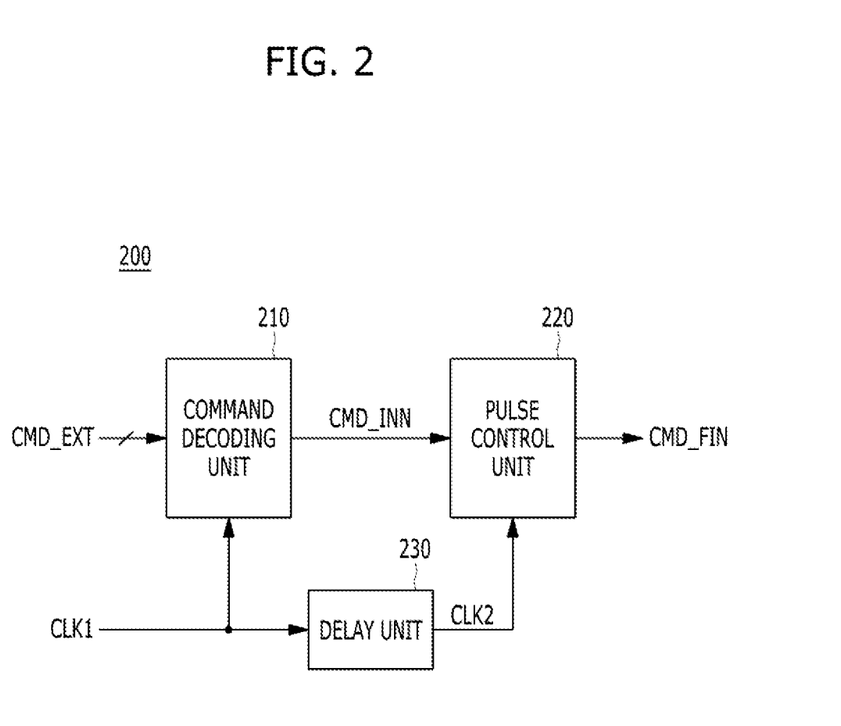
FIG. 2 is a block diagram illustrating an internal command signal generating circuit of a semiconductor device in accordance with an embodiment of the present invention.

FIG. 2 is a block diagram illustrating an internal command signal generating circuit 200 of a semiconductor device in accordance with an embodiment of the present invention.

Referring to FIG. 2, the internal command signal generating circuit 200 may include a command decoding unit 210, a pulse control unit 220, and a delay unit 230.

The command decoding unit 210 decodes external command signals CMD_EXT to generate an internal command signal CMD_INN. Here, the internal command signal CMD_INN is synchronized with a first clock signal CLK1.

The pulse control unit 220 controls the pulse width of the internal command signal CMD_INN to generate a final internal command signal CMD_FIN.

The delay unit 230 reflects a delay time corresponding to the decoding operation of the command decoding unit 210 into the first clock signal CLK1, and generates a second clock signal CLK2. The command decoding unit 210 receives the external command signals CMD_EXT and performs a decoding operation on the received signals, where a predetermined period of time is required to perform the decoding operation. Therefore, to use the internal command signal CMD_INN synchronized with the first clock signal CLK1 in the pulse control unit 220, the first clock signal CLK1 is delayed as much as a delay time corresponding to the decoding operation.

Figure 3:
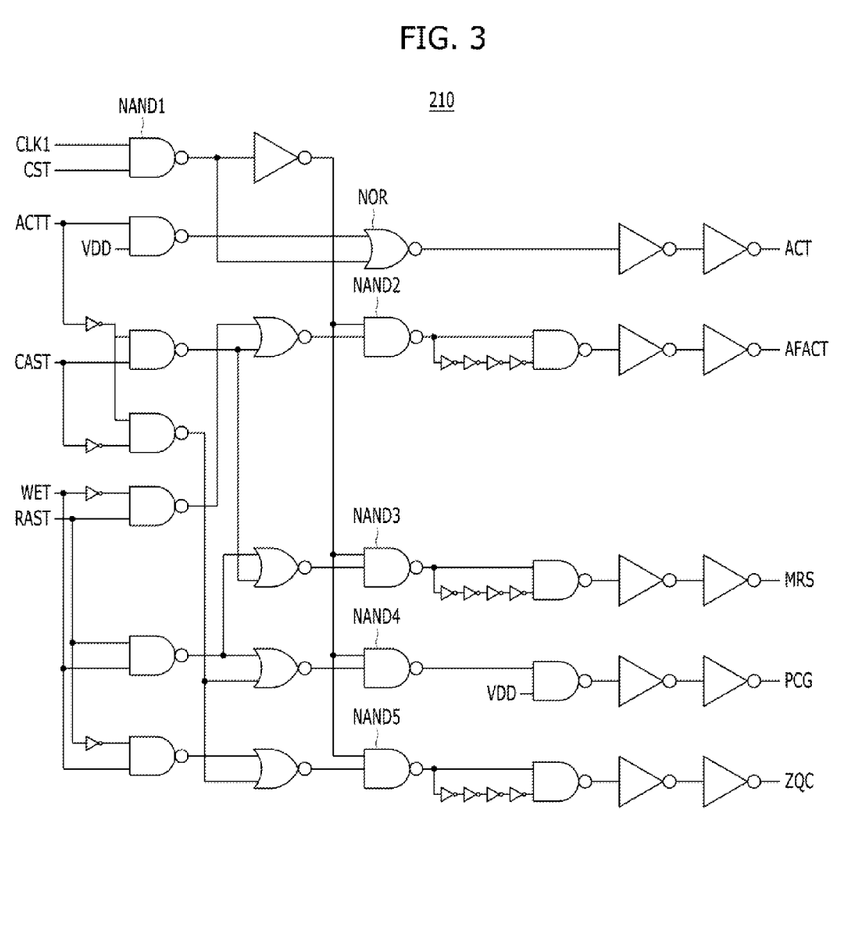
FIG. 3 is a detailed diagram of a command decoding unit illustrated in FIG. 2.

FIG. 3 is a detailed diagram of the command decoding unit 210 illustrated in FIG. 2.

Referring to FIG. 3, the command decoding unit 210 receives and decodes external command signals "CST", "ACTT", "CAST", "WET" and "RAST", which are external command signals CMD_EXT (see FIG. 2), and generates internal command signals "ACT", "AFACT", "MRS", "PCG", "ZQC", and the like, each of which is an internal command signal CMD_INN (see FIG. 2). Here, the external command signals "CST", "ACTT", "CAST", "WET" and "RAST" correspond to a chip select signal, an active signal, a column address strobe signal, a write enable signal and a row address strobe signal, respectively. In addition, the internal command signals "ACT", "AFACT", "MRS", "PCG" and "ZQC" are internal command signals for activating corresponding operations. The internal command signal "ACT" is a signal for an active operation, the internal command signal "AFACT" is a signal for a refresh operation, the internal command signal "MRS" is a signal for a mode setting operation, the internal command signal "PCG" is a signal for a precharge operation, and the internal command signal "ZQC" is a signal for the impedance calibration operation of an output pad.

Hereinafter, the circuit operation will be briefly described.

First, the first clock signal CLK1, which is an external clock signal, is a toggling signal, and is inputted to a first NAND gate NAND1 together with the external command signal "CST". Accordingly, when the external command signal "CST" is activated, the first clock signal CLK1 is outputted from the first NAND gate NAND1. The first clock signal CLK1 outputted from the first NAND gate NAND1 is inputted to a NOR gate NOR and second to fifth NAND gates NAND2, NAND3, NAND4 and NAND5, and thus is used to synchronize signals obtained by decoding external command signals "ACTT", "CAST", "WET" and "RAST". In addition, the output signals of the NOR gate NOR and the second to fifth NAND gates NAND2, NAND3, NAND4 and NAND5 become internal command signals "ACT", "AFACT", "MRS", "PCG" and "ZQC".

Meanwhile, the pulse widths of the internal command signals "ACT", "AFACT", "MRS", "PCG" and "ZQC" are shorter than tCK/2 of the first clock signal CLK1. In the semiconductor device according to the embodiment of the present invention, the pulse widths of the internal command signals may be controlled by the pulse control unit 220 to be described later. Hereinafter, for convenience of description, FIG. 4 will be described on the assumption that any one of the internal command signals "ACT", "AFACT", "MRS", "PCG" and "ZQC" is an internal command signal CMD_INN.

Figure 4:
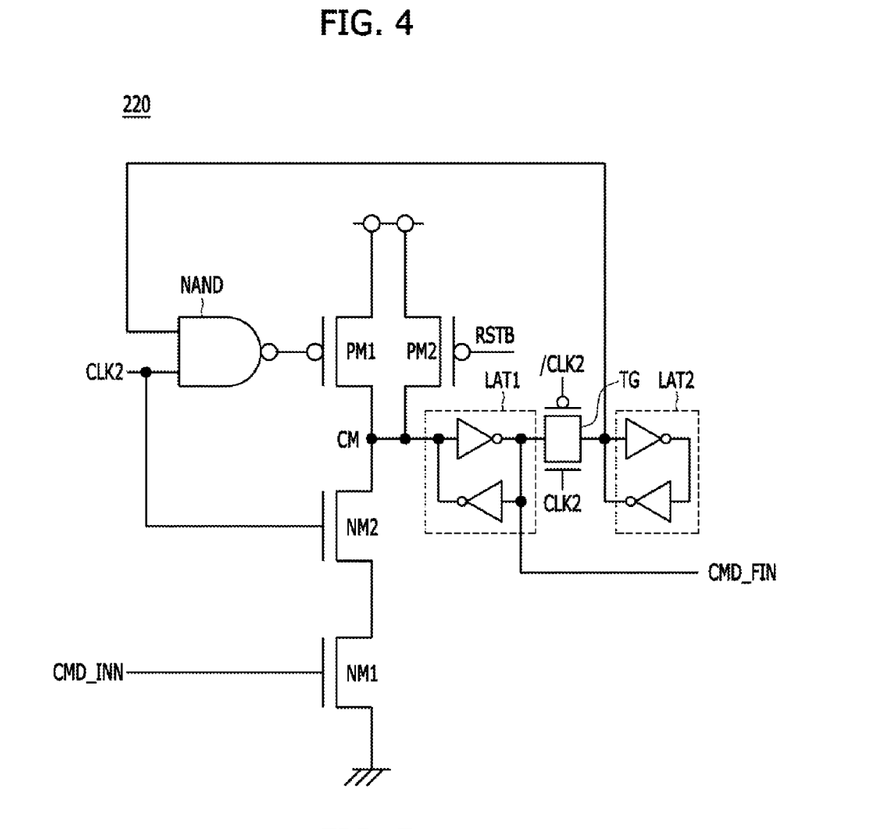
FIGS. 4 and 5 are detailed diagrams of a pulse controller illustrated in FIG. 2.

FIG. 4 is a detailed diagram of the pulse control unit 220 illustrated in FIG. 2.

Referring to FIG. 4, the pulse control unit 220 includes a NAND gate NAND, first and second NMOS transistors NM1 and NM2, first and second PMOS transistors PM1 and PM2, first and second latch LAT1 and LAT2, and a transmission gate TG. The internal command signal CMD_INN is inputted to the first NMOS transistor NM1, and the second clock signal CLK2 is inputted to the NAND gate NAND and the second NMOS transistor NM2. The first PMOS transistor PM1 receives the output signal of the NAND gate NAND and pull-up drives a common node CM, and the second PMOS transistor PM2 receives a reset signal RSTB and pull-up drives a common node CM. The common node is coupled to the first latch LAT1, and the output signal of the first latch LAT1 becomes the final internal command signal CMD_FIN. In addition, the output signal of the first latch LAT1 is transferred to the second latch LAT2 through the transmission gate TG, which operates in response to the second clock signal CLK2 and an inverted clock signal /CLK2 of the second clock signal CLK2. The output signal of the second latch LAT2 is fed back to the NAND gate NAND.

Through such a configuration, the pulse control unit 220 receives the internal command signal CMD_INN, controls the pulse width thereof to correspond to 1tCK of the second clock signal CLK2, and then outputs the final internal command signal CMD_FIN. That is, the final internal command signal CMD_FIN has a pulse width corresponding to 1tCK.

Figure 5:
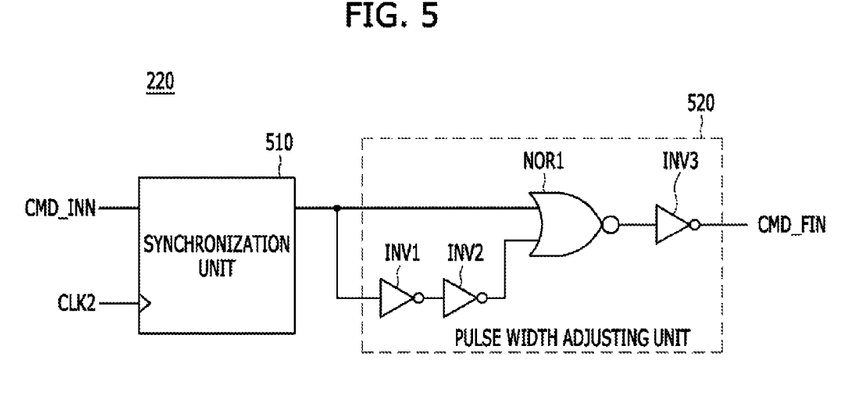

FIG. 5 is another detailed diagram of the pulse control unit 220 illustrated in FIG. 2.

Referring to FIG. 5, the pulse control unit 220 may include a synchronization unit 510 and a pulse width adjusting unit 520.

The synchronization unit 510 synchronizes an internal command signal CMD_INN with the second clock signal CLK2. For example, the synchronization unit 510 may include a flip-flop. In addition, the pulse width adjusting unit 520 adjusts a pulse width of the output signal of the synchronization unit 510 to generate a final internal command signal CMD_FIN. The pulse width adjusting unit 520 may include a NOR gate NOR1 and first to third inversion gates INV1, INV2 and INV3.

Through such a configuration, the pulse control unit 220 generates the final internal command signal CMD_FIN which is synchronized with the second clock signal CLK2 and has a pulse width longer than the pulse width of the internal command signal CMD_INN.

As described with reference to FIGS. 4 and 5, according to the embodiments of the present invention, the semiconductor device may generate the final internal command signal CMD_FIN having a pulse width longer than internal command signal CMD_INN (or an external command signal).

Figure 6:
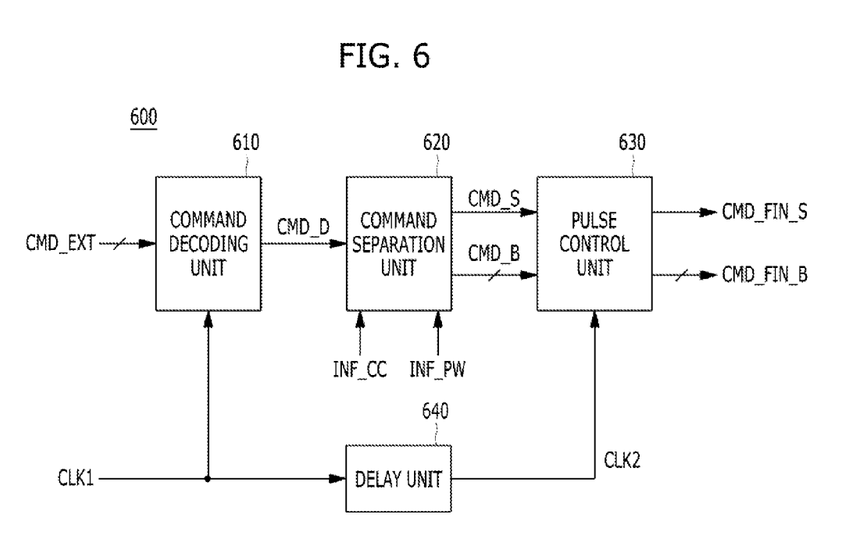
FIG. 6 is a block diagram illustrating an internal command signal generating circuit of a semiconductor device in accordance with an embodiment of the present invention.

FIG. 6 is a block diagram illustrating an internal command signal generating circuit 600 of a semiconductor device in accordance with an embodiment of the present invention.

Referring to FIG. 6, the internal command signal generating circuit 600 may include a command decoding unit 610, a command separation unit 620, a pulse control unit 630, and a delay unit 640.

The command decoding unit 610 decodes external command signals CMD_EXT, to output a decoded command signal CMD_D, in response to a first clock signal CLK1. Such a configuration has been already described with reference to FIGS. 2 and 3, so a description thereof will be omitted.

The command separation unit 620 separates the decoded command signal CMD_D into a first interval command signal CMD_S and a second interval command signal CMD_B, and outputs the first interval command signal CMD_S and the second interval command signal CMD_B in response to command interval information INF_CC and pulse width information INF_PW. Here, the command interval information INF_CC corresponds to an application interval of external commands, and the pulse width information INF_PW corresponds to an adjusted pulse width of the decoded command signal CMD_D. The decoded command signal CMD_D, command interval information INF_CC, and the first and second interval command signals CMD_S and CMD_B will again be described later with reference to FIG. 7. For reference, the first interval command signal CMD_S activated when external commands are inputted at an interval longer than that of the pulse width information INF_PW, and the second interval command signal CMD_B activated when external commands are inputted at an interval shorter than that of the pulse width information INF_PW. The second interval command signal CMD_B is obtained by separating the decoded command signal CMD_D that corresponds to the external commands continuously and rapidly inputted, the second interval command signal CMD_B may be defined to be plural in number. In this case, the pulse control unit 630 may include a plurality circuits each having the same configurations as the pulse control unit 220 shown in FIG. 4 or 5.

The pulse control unit 630 controls the respective pulse widths of the first interval command signal CMD_S and the second interval command signal CMD_B, and generate a first final internal command signal CMD_FIN_S and a second final internal command signal CMD_FIN_B. Here, the second final internal command signal CMD_FIN_B may be defined to be plural in number when the second interval command signal CMD_B is defined to be plural in number.

The delay unit 640 reflects a delay time corresponding to the operating times of the command decoding unit 610 and the command separation unit 620 into the first clock signal CLK1, and generates a second clock signal CLK2.

According to the embodiment of the present invention, the semiconductor device may control the pulse width of the external command signals CMD_EXT to be stably used in the internal circuit thereof. In addition, it is possible to generate the first interval command signal CMD_B or the second interval command signal CMD_B according to an application interval of external commands.

Meanwhile, although it is not shown in FIG. 6, the second final internal command signals CMD_FIN_B will be provided to a designed circuit, so that circuits provided with the second final internal command signals may be plural in number.

Figure 7:
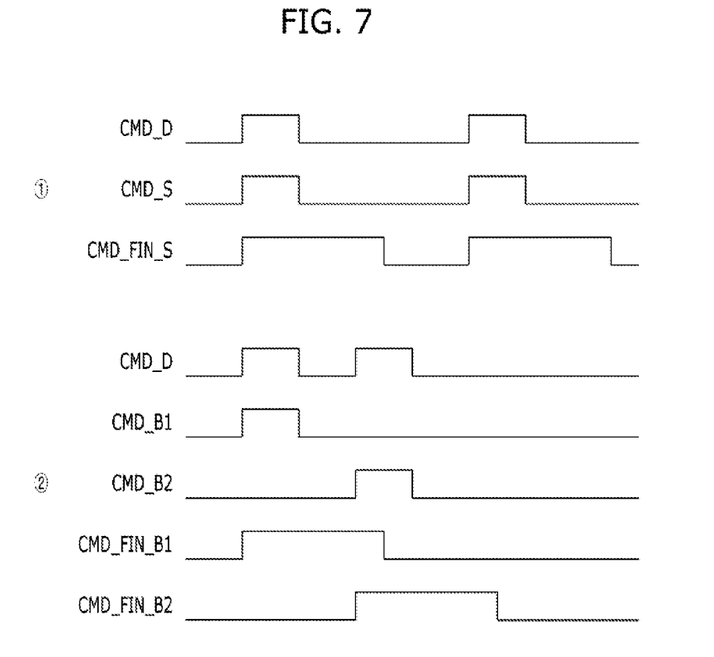
FIG. 7 is a timing diagram for describing an operation of the semiconductor device illustrated in FIG. 6.

FIG. 7 is a timing diagram for describing an operation of the semiconductor device illustrated in FIG. 6. For convenience of description, the description will be given for case ① and case ② depending on an application interval of external commands, and particularly, case ② will be described with an example in which two second interval command signals CMD_B1 and CMD_B2 exists.

First, the following description will be given on case ① in which an application interval of external commands is longer than pulse width information INF_PW. Here, the pulse width information INF_PW may denote the pulse width of a first final internal command signal CMD_FIN_S.

When the decoded command signal CMD_D is activated two times, the first interval command signal CMD_S is activated two times in response to the decoded command signal CMD_D. In addition, the pulse control unit 630 adjusts the pulse width of the first interval command signal CMD_S, and generates the first final internal command signal CMD_FIN_S.

Then, case ② in which an application interval of external commands is shorter than pulse width information INF_PW will be described.

When the decoded command signal CMD_D is activated two times at an interval shorter than that in case ①, the command separation unit 620 generates two second interval command signals CMD_B1 and CMD_B2 corresponding to the activation of the decoded command signal CMD_D. For reference, in the command separation unit 620, the operation of distinguishing case ① and case ② from each other may be achieved by comparing command interval information INF_CC and pulse width information INF_PW. In addition, in the command separation unit 620, the operation of generating second interval command signals CMD_B1 and CMD_B2 according to the activation of decoded command signal CMD_D may be achieved using, for example, a synchronization circuit or the like. Subsequently, the pulse control unit 630 generates two second final internal command signals CMD_FIN_B1 and CMD_FIN_B2 corresponding to the second interval command signals CMD_B1 and CMD_B2, respectively.

According to the embodiment of the present invention, the semiconductor memory device may adjust the pulse width of the decoded command signal CMD_D. Subsequently, although the pulse width of the decoded command signal CMD_D is longer than the command interval information INF_CC on controlling the pulse width, the final internal command signal corresponding thereto may be generated.

For reference, the second final internal command signals CMD_FIN_B1 and CMD_FIN_B2 may correspond to a precharge operation. In this case, the second final internal command signals CMD_FIN_B1 and CMD_FIN_B2 corresponding to a precharge operation are inputted to corresponding circuits, respectively, and thus the corresponding circuits may perform a precharge operation at prearranged time points respectively.

Figure 8:
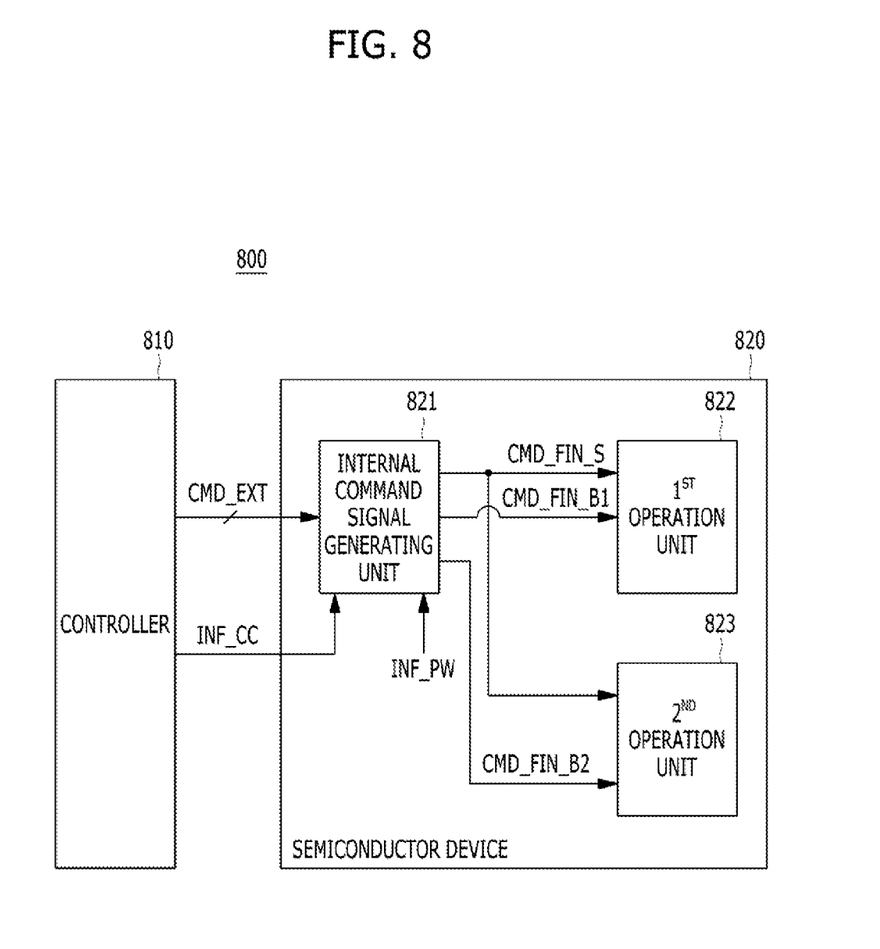
FIG. 8 is a block diagram illustrating a semiconductor system in accordance with an embodiment of the present invention.

FIG. 8 is a block diagram illustrating a semiconductor system 800 in accordance with an embodiment of the present invention.

Referring to FIG. 8, the semiconductor system 800 may include a controller and a semiconductor device 820. The controller 810 controls the semiconductor device 820 according to external command signals CMD_EXT, and provides command interval information INF_CC to the semiconductor device 820.

The semiconductor device 820 performs an operation corresponding to the external command signals CMD_EXT. The semiconductor device 820 may include an internal command signal generating unit 821 and first and second operation units 822 and 823.

The internal command signal generating unit 821 receives the external command signals CMD_EXT, and generates a first final internal command signal CMD_FIN_S and two second final internal command signals CMD_FIN_B1 and CMD_FIN_B2, of which the configuration and operation have been already described with reference with FIGS. 6 and 7. For reference, FIG. 6 has been explained with a plurality of second final internal command signals CMD_FIN_B as an example, and FIG. 7 has been explained with two second final internal command signals CMD_FIN_B1 and CMD_FIN_B2 as an example.

The first and second operation units 822 and 823 perform operations corresponding to the external command signals CMD_EXT in response to the first final internal command signal CMD_FIN_S and the second final internal command signals CMD_FIN_B1 and CMD_FIN_B2.

The operation will be briefly described with reference to FIGS. 7 and 8.

First, in case ① of FIG. 7, when the first final internal command signal CMD_FIN_S is activated in response to a decoded command signal CMD_D that corresponds to the external command signals CMD_EXT, the first and second operation units 822 and 823 perform operations corresponding to the decoded command signal CMD_D. In other words, in case ①, the first and second operation units 822 and 823 are both activated in response to a first activation of the decoded command signal CMD_D, and then first and second operation units 822 and 823 are both activated in response to a second activation thereof.

Subsequently, in case ② of FIG. 7, when the second final internal command signals CMD_FIN_B1 and CMD_FIN_B2 are activated in response to the decoded command signal CMD_D, the first and second operation units 822 and 823 perform operations corresponding to the decoded command signal CMD_D in regular sequence. In other words, in case ②, the first operation unit 822 is activated in response to a first activation of the decoded command signal CMD_D, and the second operation unit 823 is activated in response to a second activation of the decoded command signal CMD_D.

According to the embodiment of the present invention, in the semiconductor system, it is possible to control the operating regions of the first and second operation units 822 and 823 according to an application interval of external commands.

Since stable internal command signals are generated, the reliability of the operation of a semiconductor device may increase.

Although various embodiments have been described for illustrative purposes, it will be apparent to those skilled in the art that various changes and modifications may be made without departing from the spirit and scope of the invention as defined in the following claims.

In addition, the positions and types of the logic gates and transistors illustrated in the above embodiments may be realized differently according to the polarity of an input signal.

What is claimed is:
1. A semiconductor device comprising:
   a command decoding unit configured to decode external command signals to generate an initial internal command signal; and
   a command separation unit configured to separate the initial internal command signal into first and second interval command signals, and selectively output the first and second interval command signals in response to command interval information and pulse width information; and
   a pulse control unit configured to control a pulse width of the first and second interval command signals,
   wherein the pulse control unit is configured to output first and second final internal command signals which have a pulse width longer than the pulse width of the initial internal command signal, and
   wherein the command interval information corresponds to an application interval of external commands, and the pulse width information corresponds to an adjusted pulse width of the initial internal command signal.
2. The semiconductor device of claim 1, further comprising a delay unit configured to add a delay time corresponding to a decoding operation of the command decoding unit into a first clock signal to generate a second clock signal by modeling the command decoding unit.

3. The semiconductor device of claim 2, wherein the pulse control unit is configured to output the first and second final internal command signals in response to the second clock signal.

4. The semiconductor device of claim 3, wherein the pulse control unit is configured to adjust the pulse width of the first and second interval command signals to have a pulse width corresponding to one clock cycle of the second clock signal, and outputs the final internal command signal.

5. A semiconductor device comprising:
a command decoding unit configured to decode external command signals to generate an initial internal command signal;
a command separation unit configured to separate the decoded command signal based on first information corresponding to an application interval of external commands, and second information corresponding to a pulse width of a final internal command signal;
a pulse control unit configured to adjust an output signal of the command separation unit to have a pulse width corresponding to the second information, and generate the final internal command signal having the pulse width longer than a pulse width of the initial internal command signal; and
a plurality of operation units configured to perform operations corresponding to the external command signals in response to the final internal command signals.

6. The semiconductor device of claim 5, wherein the command separation unit is configured to compare the first information and the second information to output the decoded command signal as it is, or separates the decoded command signal in regular sequence.

7. The semiconductor device of claim 5, wherein the operation units are configured to be simultaneously or sequentially activated in response to the final internal command signal.

8. A semiconductor system comprising:
a controller that outputs external command signals at a preset interval; and
a semiconductor device configured to decode the external command signals to generate an initial internal command signal,
wherein the semiconductor device includes a plurality of operation units, and is configured to compare a first information corresponding to the preset interval with a second information corresponding to a pulse width of the initial internal command signal, adjust a pulse width of the initial internal command signal, and control an operation unit corresponding to the initial internal command signal to operate in response to the external command signal,
wherein the controller is configured to provide the semiconductor device with the first information corresponding to the preset interval,
wherein the semiconductor device further comprises an internal command signal generating unit configured to generate the initial internal command signal based on the first information corresponding to the preset interval and the second information corresponding to the pulse width of the initial internal command signal.

9. The semiconductor system of claim 8, wherein the internal command signal generating unit comprises:
a command decoding unit configured to decode the external command signals to generate the initial internal command signal;
a command separation unit configured to separate the decoded command signal based on the first information corresponding to the preset interval and the second information corresponding to the pulse width of the initial internal command signal; and
a pulse control unit configured to adjust an output signal of the command separation unit to have the pulse width, and generate the initial internal command signal.

10. The semiconductor system of claim 9, wherein the operation units are configured to be simultaneously or sequentially activated in response to the final internal command signal.

* * * * *